(12) United States Patent
Lee

(10) Patent No.: US 7,541,854 B2
(45) Date of Patent: Jun. 2, 2009

(54) DELAY APPARATUS OF SYNCHRONIZING CIRCUIT HAVING IMPROVED JITTER CHARACTERISTIC AND METHOD OF CONTROLLING THE SAME

(75) Inventor: Ki-Won Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 46 days.

(21) Appl. No.: 11/647,434

(22) Filed: Dec. 29, 2006

(65) Prior Publication Data
US 2008/0042716 A1  Feb. 21, 2008

(30) Foreign Application Priority Data
Jun. 27, 2006  (KR) .................. 10-2006-0057831

(51) Int. Cl.
H03H 11/26  (2006.01)
(52) U.S. Cl. ................ 327/266; 327/270; 327/287
(58) Field of Classification Search ........ 327/261, 327/263, 264, 266, 270, 272, 274, 285, 287; 331/57
See application file for complete search history.

(56) References Cited

U.S. PATENT DOCUMENTS

| 5,638,014 | A |   | 6/1997 | Kurita |
| 5,699,024 | A | * | 12/1997 | Manlove et al. ............. 331/111 |
| 5,936,441 | A |   | 8/1999 | Kurita |
| 6,037,812 | A |   | 3/2000 | Gaudet |
| 6,043,719 | A | * | 3/2000 | Lin et al. ....................... 331/57 |
| 6,133,773 | A | * | 10/2000 | Garlepp et al. .............. 327/247 |
| 6,157,266 | A | * | 12/2000 | Tsai et al. ..................... 331/57 |
| 6,229,403 | B1 | * | 5/2001 | Sekimoto ..................... 331/57 |
| 6,462,623 | B1 | * | 10/2002 | Horan et al. .................. 331/17 |
| 6,472,921 | B1 | * | 10/2002 | Rao et al. .................... 327/237 |
| 6,771,105 | B2 | * | 8/2004 | Andrasic et al. ............ 327/276 |
| 6,894,552 | B2 | * | 5/2005 | Iorga et al. .................. 327/280 |
| 6,911,857 | B1 |   | 6/2005 | Stiff |

FOREIGN PATENT DOCUMENTS

| JP | 64-042096 | 2/1989 |
| JP | 2017886 | 1/1990 |
| JP | 2000-124797 | 4/2000 |
| JP | 2001-007287 | 1/2001 |
| JP | 2002185316 | 6/2002 |
| KP | 1020040109986 | 12/2004 |
| KR | 10-1998-0060861 | 10/1998 |

\* cited by examiner

*Primary Examiner*—Lincoln Donovan
*Assistant Examiner*—Hai L. Nguyen
(74) *Attorney, Agent, or Firm*—Venable LLP; Jeffri A. Kaminski

(57) ABSTRACT

A delay apparatus of a synchronizing circuit and a method of controlling the same are provided. In order to improve jitter characteristics, the delay apparatus includes delay units delaying input signal by variable delaying devices according to, a predetermined voltage, and a current amount control unit that changes a unit variation amount of the delay.

15 Claims, 5 Drawing Sheets

DELAY APPARATUS OF SYNCHRONIZING CIRCUIT HAVING IMPROVED JITTER CHARACTERISTIC AND METHOD OF CONTROLLING THE SAME

BACKGROUND OF THE INVENTION

1. Technical Field

The present invention relates to a semiconductor integrated circuit, and more particularly, to a delay apparatus of a synchronizing circuit and a method of controlling the same.

2. Related Art

A synchronizing circuit according to the related art is divided into a delay locked loop (hereinafter, simply referred to as "DLL") and a phase locked loop (hereinafter, simply referred to as "PLL").

As shown in FIG. 1, the DLL uses a delay line, and the delay line includes a plurality of delay units 10, for example, four delay units 10. The first delay unit 10 has two input terminals IN1 and IN2 to which a clock and the inverted clock are input, respectively.

A delay time of each of the delay units 10 is determined by a first control voltage (hereinafter, referred to as "VBP") that is commonly input to the delay units 10. Further, the delay units 10 commonly receive a second control voltage (hereinafter, simply referred to as "VCN") such that swing widths of output signals are uniform.

Meanwhile, the PLL uses a voltage controlled oscillator (hereinafter, simply referred to as "VCO"). As shown in FIG. 2, the VCO uses a delay line that is almost same the delay line of the DLL. But, a first delay unit 10 of the PLL is fed back output signals OUT and OUTB of the VCO.

As described above, the delay lines that include the plurality of delay units need to be used for the synchronizing circuits, such as the DLL, the PLL, and the like. The circuits that use the analog-type delay units are very sensitive to a physical mismatch and variations in PVT (Process/Voltage/Temperature). Therefore, when the delay units are designed, in order to increase the yield of the delay units, a range of an operating frequency is determined to cope with all of the above-described variations.

However, in the delay units of the synchronizing circuit according to the related art, as the range of the operating frequency is determined to cope with all of the variations when designing the circuits, jitter characteristics become worse, thereby deteriorating the performance of a device to which the delay units are applied. In particular, the wider the operating frequency band a system has, the more the performance of the system decreases due to the deterioration of the jitter characteristics.

SUMMARY OF THE INVENTION

Embodiments of the present invention provide a delay apparatus of a synchronizing circuit and a method of controlling the same that can improve jitter characteristics in response to PVT variation.

An embodiment of the present invention provides a delay apparatus of a synchronizing circuit, which includes: delay units delaying an input signal with variable delaying devices according to a predetermined voltage; and a current amount control unit that changes a unit variation amount of the delay.

Another embodiment of the present invention provides a method of controlling a delay apparatus of a synchronizing circuit that includes a variable resistor having a resistance value varying according to a control voltage, and a current control unit changing the amount of current flowing through the variable resistor through a plurality of signal paths, which includes changing a unit amount of current flowing through the variable resistor by selectively connecting at least one of the plurality of signal paths in a test mode, and adjusting the current control unit such that the at least one signal path corresponding to the unit amount of current that is determined in the test mode remains connected.

DESCRIPTION OF EXEMPLARY EMBODIMENTS

Embodiments of the present invention will now be described in detail with reference to the accompanying drawings.

Figure 1:
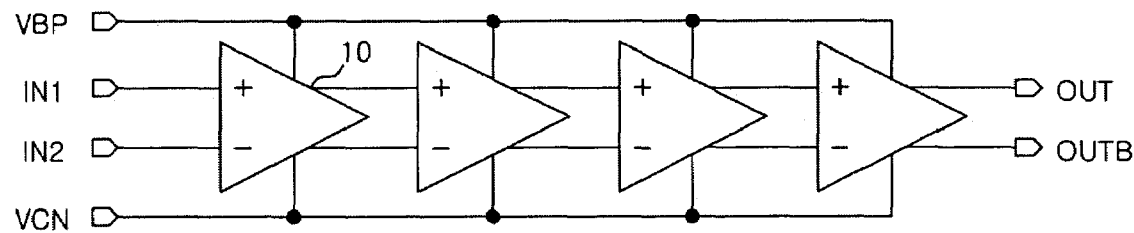
FIG. 1 is a block diagram of a conventional delay line of a delay locked loop.
Figure 2:
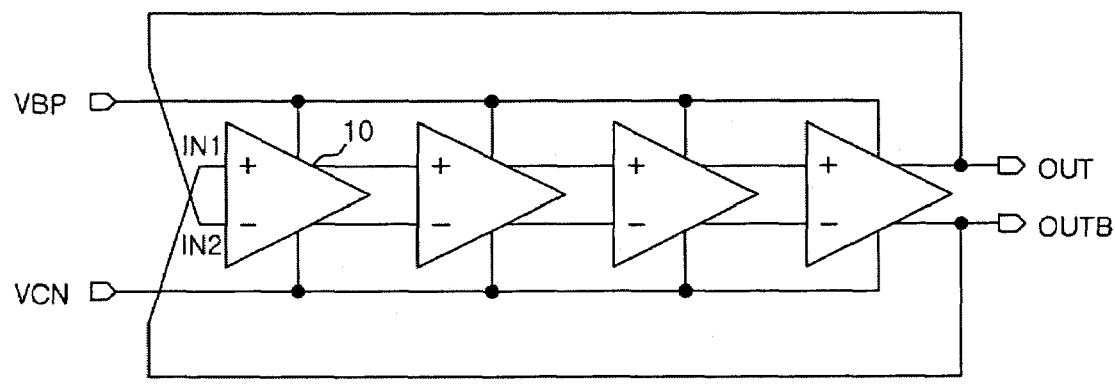
FIG. 2 is a block diagram of a conventional delay line of a phase locked loop.
Figure 3:
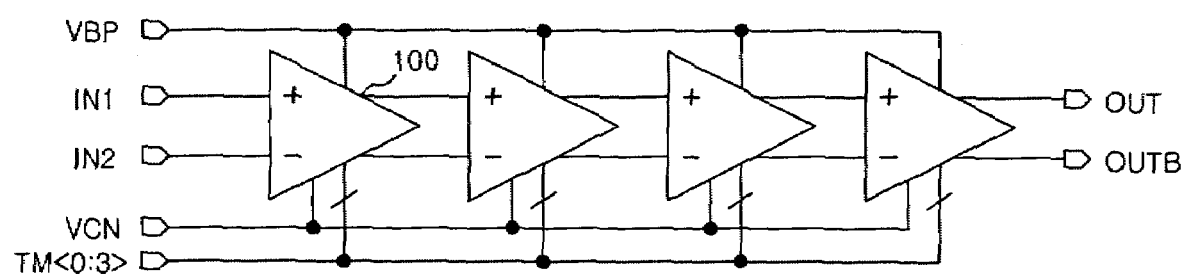
FIG. 3 is a block diagram of a conventional delay line according to an embodiment of the present invention.

Referring to FIG. 3, a delay line of a synchronizing circuit according to an embodiment of the present invention includes a plurality of delay units 100 that are connected in series to one another. A delay amount of each of the delay units 100 is changed according to a first control voltage (hereinafter, referred to as "VBP"), and a varying range of the delay amount is changed according to a second control voltage (hereinafter, referred to as "VCN").

Figure 4:
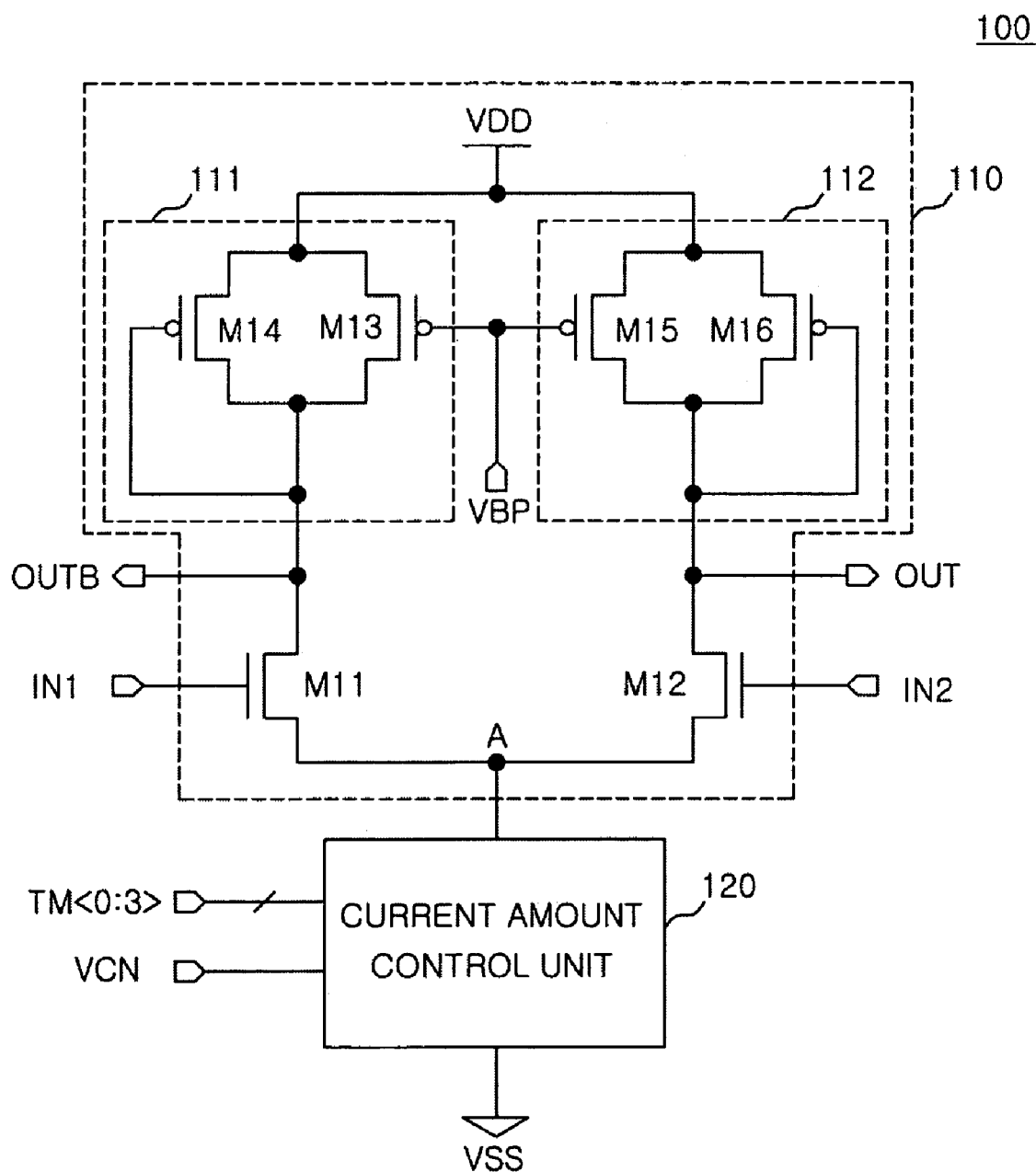
FIG. 4 is a circuit diagram of a delay unit according to an embodiment of the present invention.

Referring to FIG. 4, the delay unit 100 may include a delay section 110 and a current amount control unit 120.

The delay section 110 delays an input signal with a variable delaying device according to the first control voltage VBP. The delay section 110 includes a first variable resistor 111 and a second variable resistor 112 as the variable delaying device. The first and second variable resistors 111 and 112 have one terminal connected to a power supply terminal VDD. Resistances of the first and second variable resistors 111 and 112 are varied by the first control voltage VBP. The delay section 110 may further includes a first transistor M11 having a source connected to the second terminal of the first variable resistor 111 and a gate connected to a first input terminal IN1, and a second transistor M12 having a source connected to the second terminal of the second variable resistor 112, a gate connected to a second input terminal IN2, and a drain connected to a drain of the first transistor M11. A first output terminal OUT is connected to a connection node between the second terminal of the second variable resistor 112 and the source of the second transistor M12. A second output terminal OUTB is connected to a connection node between the second terminal of the first variable resistor 111 and the source of the first transistor M11.

The first variable resistor 111 includes a third transistor M13 having a source connected to the power supply terminal VDD and a gate receiving the VBP, and a fourth transistor M14 having a source connected to the power supply terminal VDD, and a gate and a drain connected to a drain of the third transistor M13.

The second variable resistor 112 includes a fifth transistor M15 having a source connected to the power supply terminal VDD and a gate receiving the VBP, and a sixth transistor M16 having a source connected to the power supply terminal VDD, and a gate and a drain that are connected to a drain of the fifth transistor M15. Thus, the resistances of the first variable resistor 111 and the second variable resistor 112 maybe impedance of the MOS transistor M13 to M14 and M15 to M16.

Figure 5:
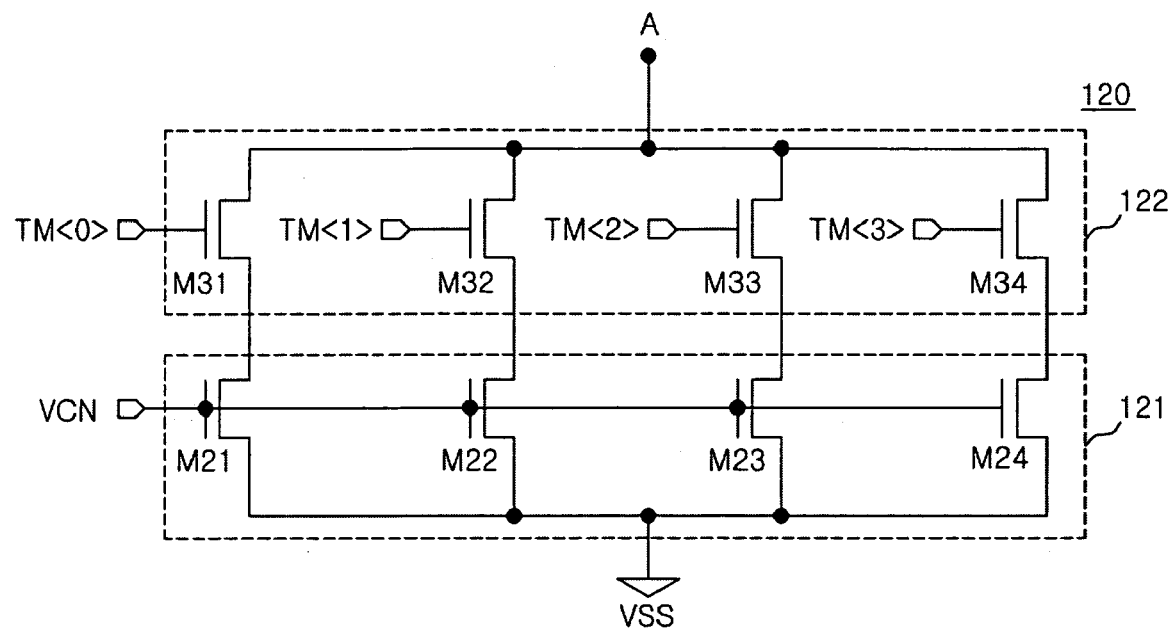
FIG. 5 is a circuit diagram of a current amount control unit of FIG. 4.

The current amount control unit 120 changes a unit variation amount of the delay according to the VCN. As shown in FIG. 5, the current amount control unit 120 may include an impedance providing unit 121 that includes devices having different resistances according to the VCN, and a switching section 122 that forms a current path through which the delay section 110 and at least one of the resistors of the resistor array 121 are connected to each other according to a test signal (hereinafter, referred to as "TM<0:3>").

The impedance providing unit 121 may include a plurality of transistors M21 to M24, each of which has a drain connected to a ground terminal and a gate receiving the VCN. In order to have different impedance(i.e., resistance) of the transistors M21 to M24, the transistors M21 to M24 have different sizes. For example, the impedance of the transistors M21 to M24 may have a relationship of M21>M22>M23>M24.

The switching section 122 may include a plurality of transistors M31 to M34 that have sources connected to a node A of the delay section 110, gates to which the TM<0:3> is input, and drains connected to the plurality of transistors M21 to M24 of the resistor array 121. As shown in FIG. 4, the node A is a node at which the drain of the first transistor M11 of the delay section 110 is connected to the drain of the second transistor. M12.

An operation of the delay apparatus of the synchronizing circuit according to an embodiment of the present invention that has the above-described structure will be described below.

In the delay section 110 of FIG. 4, the resistances (i.e., impedance of the M13 to M14 and M15 to M16 ) of the first and second variable resistors 111 and 112 identically increase or decrease according to a level of the VBP.

As the resistances of the first and second variable resistors 111 and 112 are changed, the delay amount is also changed. That is, when the resistances increase, the delay amount increases, and when the resistances decrease, the delay amount decreases.

Figure 6:
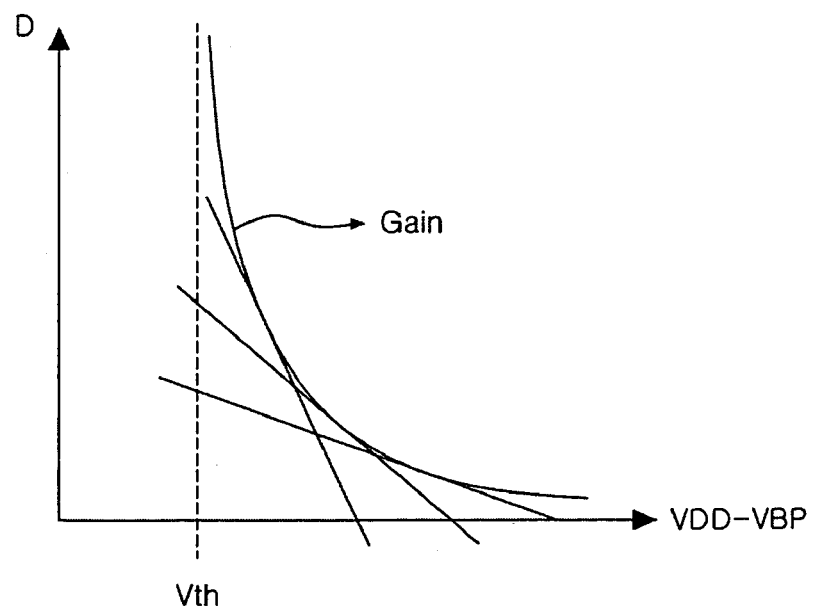
FIG. 6 is a graph illustrating characteristics of delay variation according to a variation range of a VBP in a delay unit according to an embodiment of the present invention.

FIG. 6 is a graph showing the unit variation amount of the delay according to the change of the VBP, that is, a gain. As shown in FIG. 6, the inclination of a curve is so large that there exists a period in which the delay D is rapidly changed in a region where levels of the PMOS transistors M13 and M15 forming the first and second variable resistors 111 and 112 of FIG. 4, respectively, are equal to or higher than a level of a threshold voltage Vth.

When the delay apparatus operates by changing the VBP in the period in which the delay D is rapidly changed, the gain becomes so large that a jitter may be caused.

In the graph of FIG. 6, it is preferable that the period in which the delay D is gradually changed be set as the range of the VBP. However, it can be different due to PVT variation.

Therefore, even when the unit variation of the delay is changed due to the PVT variation, the delay apparatus according to an embodiment of the present invention controls the current amount by the current amount control unit 120 of FIG. 4 in a test mode, and thus improves the unit variation of the delay to a desired level.

That is, the TM<0:3> is selectively enabled according to a predetermined combination order, and then is input to the current amount control unit 120. At this time, the transistors M21 to M24 of the resistor array 121 have different impedances (resistances), which are known. Therefore, in order that the impedances (resistances), of the resistors (i.e., transistors M21 to M24) of the impedance providing unit 121 can gradually increase or decrease, the combination order of the TM <0:3> is determined by the order in which the transistors M31 to M34 of the switching section 122 corresponding to the resistance are turned on.

At this time, when the impedances of the impedance providing unit 121 increases, the current amount decreases, and when the impedances decrease, the current amount increases. As such, the current amount is adjusted by the current amount control unit 120 according to the TM<0:3> that is selectively enabled. As a result, the variation of the delay D according to the change of the VBP is shown in a graph of FIG. 7.

Figure 7:
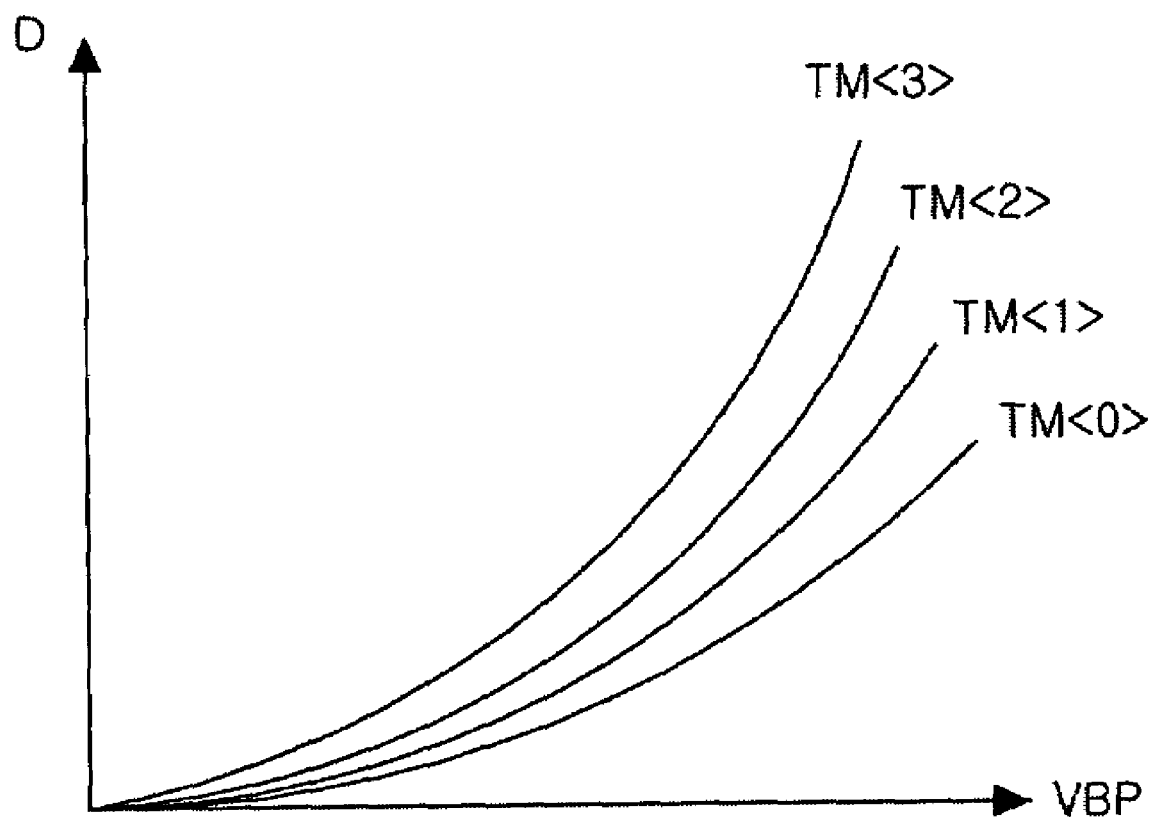
FIG. 7 is a graph illustrating a delay variation according to a variation of a VBP in a delay unit according to an embodiment of the present invention.

Referring to FIG. 7, delay characteristics of signals that are respectively output according to the combinations of the TM<0:3> are monitored, and the combination of the TM<0: 3> that corresponds to a desired level of the unit variation of the delay is determined.

When assuming that the determined TM<0:3> combination is TM<1>=low, and TM<0, 2, 3>=high, the gate of the transistor M32, which receives the TM<1>, among the transistors of the switching section 122 of FIG. 5, is connected to the power supply terminal VDD by using a metal line.

Therefore, when the test mode is completed and a normal mode starts, the TM<0:3> is disabled at a low level. However, since the transistor M32 of the switching section 122 of FIG. 5 remains turned on, the transistor M22 of the resistor array 121 operates according to the VCN, and controls the current amount of the delay unit 100 of FIG. 4.

As a result, according to a method of the embodiment of the present invention, it is possible to adjust the unit variation of the delay to a desired level so as to improve the jitter characteristics.

It will be apparent to those skilled in the art that various modifications and changes may be made without departing from the scope and spirit of the present invention. Therefore, it should be understood that the above embodiments are not limiting, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

The delay apparatus of the synchronizing circuit and the method of controlling the same according to an embodiment of the present invention can change a range in which the delay amount is changed to an optimal level so as to match the PVT characteristics. Therefore, the operating frequency band can be increased, the performance of a system to which the delay units are applied can be improved, and the operation reliability of the system can be improved.

What is claimed is:

1. A delay apparatus of a synchronizing circuit, the delay apparatus comprising:
   delay units configured to delay an input signal with variable delaying devices according to a first control voltage; and a current amount control unit configured to change a unit variation amount of the delay according to a test signal, wherein the current amount control unit includes:
an impedance providing unit having different impedances based on a second control voltage, and
a switching section that forms a current path, through which the delay unit is connected to the impedance providing unit according to the test signal.

2. The delay apparatus of claim 1,
wherein the impedance providing unit includes a plurality of transistors, each of which has a drain connected to a ground terminal and a gate receiving the second control voltage.

3. The delay apparatus of claim 1,
wherein the switching section includes a plurality of transistors, each of which
has a source connected to the delay unit, a gate configured to receive the test signal, and a drain connected to the impedance providing unit.

4. The delay apparatus of claim 1,
wherein each of the delay units includes:
variable delaying devices comprising first and second variable resistors, each of which has first and second terminals, the first terminal connected to a power supply terminal, with a varied resistance according to the first control voltage;
a first transistor having a drain, a source connected to the second terminal of the first variable resistor and a gate connected to a first input terminal; and
a second transistor having a source connected to the second terminal of the second variable resistor, a gate connected to a second input terminal, and a drain connected to a drain of the first transistor.

5. The delay apparatus of claim 4,
wherein each of the first and second variable resistors includes:
a third transistor having a drain, a source connected to the power supply terminal and a gate configured to receive the first control voltage, and
a fourth transistor having a source connected to the power supply terminal, and a gate and a drain connected to the source of the first transistor.

6. The delay apparatus of claim 4,
wherein a second output terminal is connected to a connection node between the second terminal of the first variable resistor and the source of the first transistor.

7. The delay apparatus of claim 4,
wherein a first output terminal is connected to a connection node between the second terminal of the second variable resistor and the source of the second transistor.

8. A method of controlling a delay apparatus of a synchronizing circuit that includes a variable resistor having a resistance varying according to a control voltage, and a current control unit changing an amount of current flowing through the variable resistor through a plurality of signal paths, the method comprising:
changing a unit amount of current flowing through the variable resistor by selectively connecting at least one of the plurality of signal paths in a test mode; and
adjusting the current control unit such that the at least one signal path corresponding to the unit amount of current that is determined in the test mode remains connected.

9. The method of claim 8,
wherein, the adjusting of the current control unit further comprises connecting a power supply terminal to a structure of the current control unit that corresponds to the at least one signal path according to the unit amount of current determined in the test mode.

10. The method of claim 9,
wherein, connecting of the power supply terminal to the structure of the current control unit comprises connecting the structure of the current control unit to the power supply terminal by using a metal line.

11. The method of claim 8,
wherein in the selectively connecting of the at least one of the plurality of signal paths in the test mode comprises, repeating a combination of a test mode signal that has at least two bits.

12. The method of claim 11,
wherein the test mode signal is disabled in a normal mode.

13. A delay apparatus of a synchronizing circuit, the delay apparatus comprising:
delay units configured to delay an input signal for a delay amount according to a predetermined voltage; and
a current amount control unit configured to change a unit variation amount of the delay amount by selectively operating current paths coupled to the delay units according to a test signal, wherein the current amount control unit includes:
an impedance providing unit having different impedances based on a control voltage;
and
a switching section that selectively operates the current paths, through which the delay unit is coupled to the impedance providing unit according to the test signal.

14. The delay apparatus claim 13,
wherein the impedance providing unit includes a plurality of transistors, each of which has a drain coupled to a ground terminal and a gate receiving the control voltage.

15. The delay apparatus claim 13,
wherein the switching section includes a plurality of transistors, each of which has a source coupled to the delay unit, a gate configured to receive the test signal, and a drain coupled to the impedance providing unit.

* * * * *